(12) United States Patent
Abbink et al.

(10) Patent No.: US 7,239,135 B2
(45) Date of Patent: Jul. 3, 2007

(54) NMR GYROSCOPE

(75) Inventors: Henry C. Abbink, Westlake Village, CA (US); Edward Kanegsberg, Pacific Palisades, CA (US); Ralph A. Patterson, Moorpark, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/312,311

(22) Filed: Dec. 20, 2005

(65) Prior Publication Data

US 2006/0139029 A1    Jun. 29, 2006

(51) Int. Cl.
*G01V 3/00*    (2006.01)
(52) U.S. Cl. ....................... 324/304; 324/302
(58) Field of Classification Search ................ 324/304, 324/302, 301
See application file for complete search history.

(56) References Cited

U.S. PATENT DOCUMENTS 2,841,760 A * 7/1958 Hansen, Jr. ................. 324/300
3,103,620 A * 9/1963 Fraser ......................... 324/302
4,157,495 A    6/1979 Grover
4,450,407 A * 5/1984 Kwon et al. ................. 324/304
4,509,014 A * 4/1985 Karwacki et al. ........... 324/305
5,469,256 A * 11/1995 Hall et al. .................... 356/467

OTHER PUBLICATIONS

Knappe S et al; A Microfabricated Atomic Clock; Applied Physics Letters; Aug. 30, 2004; pp. 1460-1462; vol. 85, No. 9; American Institute of Physics, Melville, New York, US.

* cited by examiner

*Primary Examiner*—Louis M. Arana
(74) *Attorney, Agent, or Firm*—Carmen B. Patti & Assoc. LLC

(57) ABSTRACT

An NMR gyroscope in one example comprises a support structure affixed within an enclosure, an NMR cell affixed to the support structure, a plurality of permanent magnets disposed about the NMR cell to produce a magnetic field within the cell, and a field coil disposed proximate the cell to produce a modulated magnetic field transverse to the magnetic field produced by the permanent magnets.

33 Claims, 4 Drawing Sheets

NMR GYROSCOPE

BACKGROUND

This application relates generally to nuclear magnetic resonance (NMR) gyroscopes, and in particular to an exemplary architecture and implementation.

Known implementations of NMR gyroscopes (gyros) have inconveniently large packages and undesirably high power consumption. Additionally, known gyro structures mix technologies, requiring process steps and procedures that are inconsistent with efficient batch processing during manufacture.

Thus, a need exists for an NMR gyro in a relatively small package with reduced power consumption. Further, there is a need for an architecture that allows efficient batch processing during manufacture.

SUMMARY

The invention in one implementation encompasses an NMR gyro. The NMR gyro comprises a support structure affixed within an enclosure, an NMR cell affixed to the support structure, a plurality of permanent magnets disposed about the NMR cell to produce a magnetic field within the cell, and a field coil disposed proximate the cell to produce a modulated magnetic field transverse to the magnetic field produced by the permanent magnets.

In one implementation, the NMR gyro is fabricated in a batch process with a wafer structure comprising a centrally disposed micro NMR cell wafer disposed between top and bottom lid wafers, a detector wafer adjacent the NMR cell wafer, an electronics wafer including detection and signal processing electronics adjacent the detector wafer, a polarizer wafer adjacent the NMR cell wafer on a side opposite the detector wafer, an optics wafer adjacent the polarizer wafer, a laser wafer including readout and pump VCSELs adjacent the optics wafer, and a source control electronics wafer adjacent the laser wafer.

DESCRIPTION OF THE DRAWINGS

Features of exemplary implementations of the invention will become apparent from the description, the claims, and the accompanying drawings in which:

DETAILED DESCRIPTION

Figure 1:
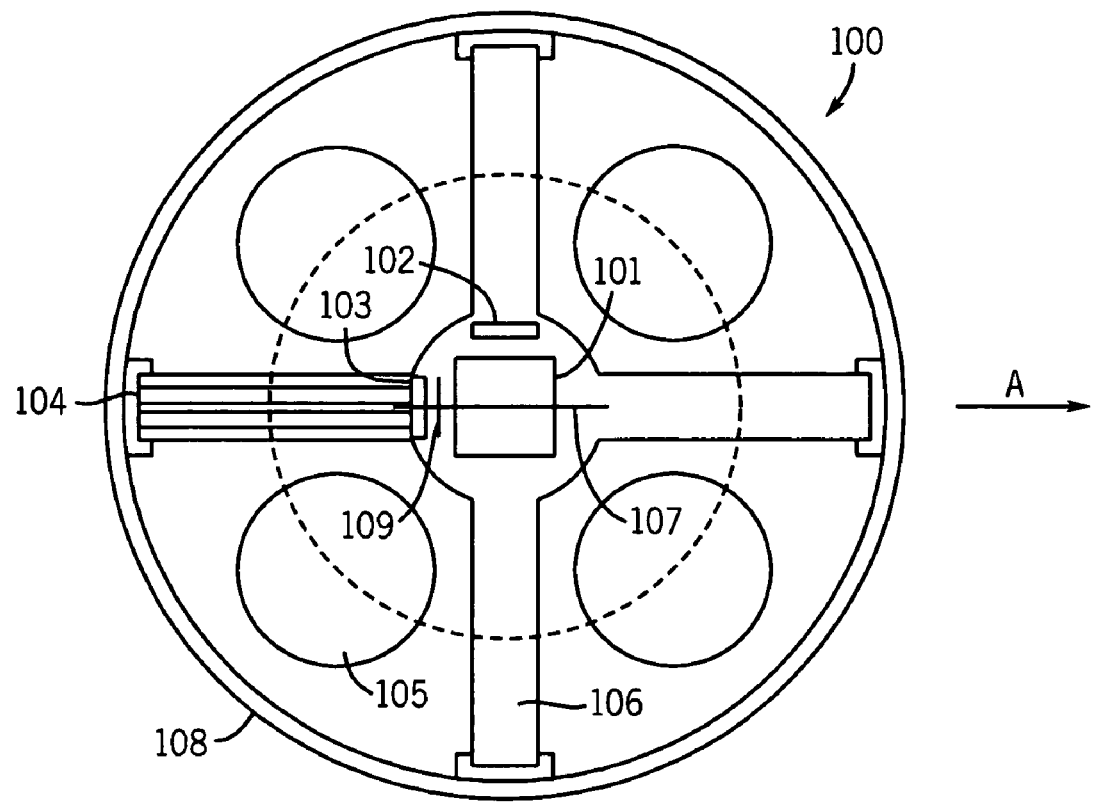
FIG. 1 is a top plan view of an NMR gyro assembly in accordance with the present invention.
Figure 2:
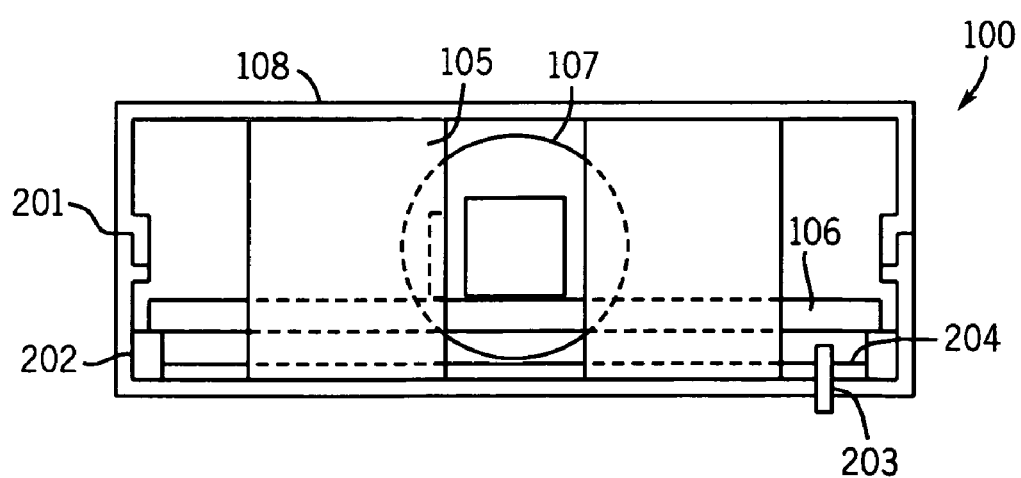
FIG. 2 is a side elevational view of the NMR gyro of FIG. 1.
Figure 3:
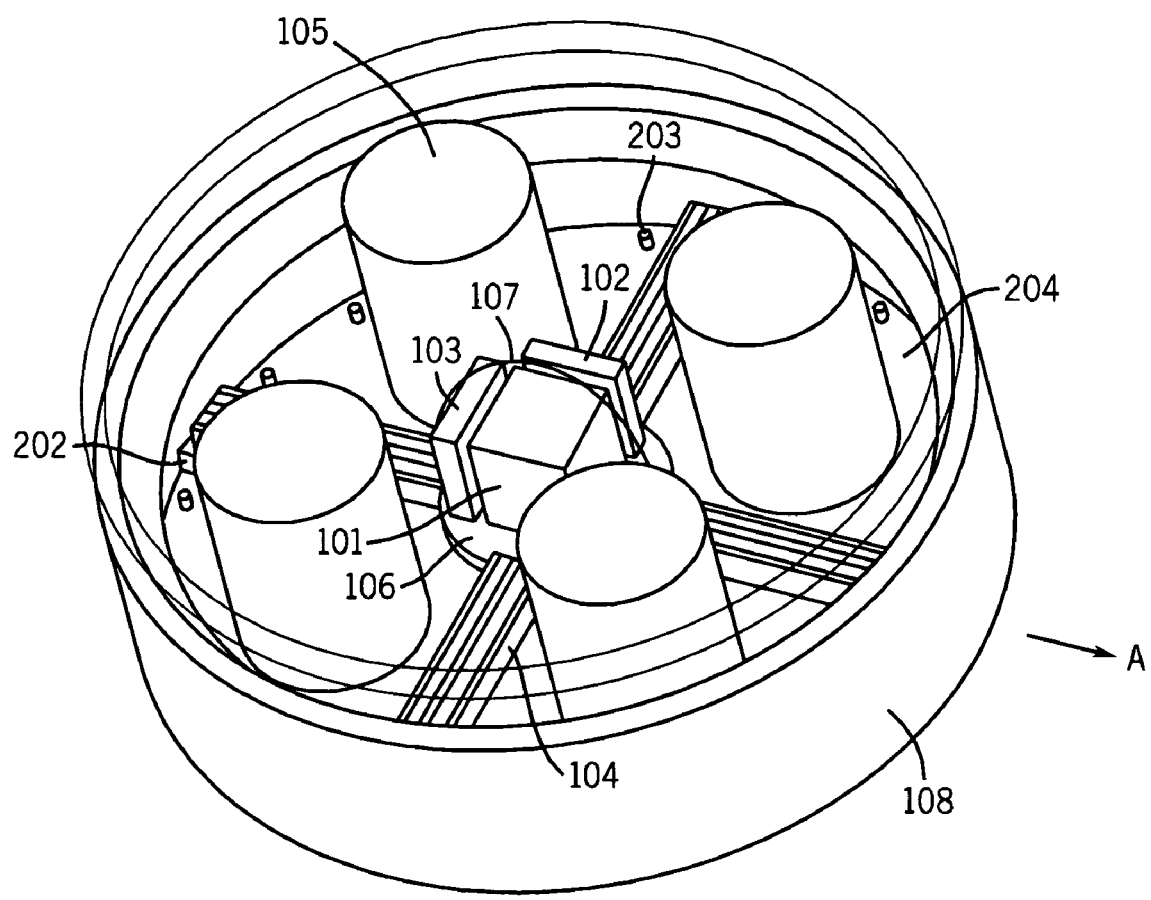
FIG. 3 is a perspective view of the NMR gyro of FIG. 1, with the cover shown in outline.

FIGS. 1-3 illustrate a compact, generally circular NMR gyro package 100. In one embodiment of the invention, the case 108 is about 16 mm in diameter and 6 mm tall. Of course, the exact shape and aspect ratio of the package could be modified after detailed consideration of magnetic field and field uniformity.

The cell 101 containing the alkali metal, gases with desired nuclear spins, such as, but not limited to, isotopes of Xe or Kr and potential buffer gas is located at or near the center of the case 108. In one embodiment of the invention, the cell 101 must be maintained at a temperature of roughly 100 deg C. The cell 101 is equipped with a heater, although this is not illustrated in the drawings. To provide a gyro with the lowest possible operating power, the cell 101 must be suspended in vacuum to minimize thermal loss. It is suspended in vacuum by the support 106. In one embodiment of the invention, the support is made from a material with a high strength to thermal conductivity ratio to minimize thermal conduction down the legs. Also on the support is a pump VCSEL 103 (Vertical Channel Surface Emitting Laser). The light output from the pump VCSEL 103 is directed along the direction about which the rotation is being measured, depicted by arrow A. Depending on the final implementation, the VCSEL chip may also be required to contain a photodetector to monitor the light reflected from a mirror deposited on the opposite face of the cell 101. The light from the pump laser must be circularly polarized. This is accomplished by inserting a quarter wave plate 109 between the pump VCSEL 103 and the cell 101.

Also on the support 106 is a VCSEL 102 with a photodetector on the chip to act as a sensor. On the cell face opposite this VCSEL 102 is a deposited mirror. The support 106 also has electrical conducting traces 104 to carry heater power and signals between the electronics and the VCSEL/cell cluster. These traces may be on any or all legs of the support, and may be on either top or bottom of the support, or on both sides.

The wavelength of the light output from the VCSELs must be tuned to the exact absorption wavelength of the alkali line. This is accomplished by adjusting the temperature of the VCSEL cavity. This in turn can be adjusted by changing the VCSEL current or by providing a heater on the VCSEL so that the optical power out of the VCSEL can be independently controlled.

The operation of the gyro requires a magnetic field along the rotation axis, depicted by arrow A. To avoid using electrical power to generate this magnetic field, permanent magnets 105 are used to generate a uniform magnetic field, in the range from about 0.1 to 10 Gauss, within the internal volume of the cell 101. The design of magnets to accomplish this is covered in U.S. Pat. No. 5,469,256, the disclosure of which is fully incorporated by reference thereto as though fully set forth herein.

The case 108 contains four support mounts 202 to which the support 106 is attached. On the floor of the case is a custom ceramic circuit board 204 that surrounds the magnets 105. The circuit board 204 contains all the electronics for control of the gyro. Much of the electronics will be contained in a single ASIC chip. There may be an innovative method for having the support mounts also make electrical interconnections between the traces on the support and traces on the ceramic circuit board 204. In the alternative, connections may be made by conventional wire bonds.

In one embodiment of the invention, the case 108 itself is made of annealed HyMu 80 to achieve maximum shielding. HyMu 80 alloy is an unoriented, 80% nickel-iron-molybdenum alloy that offers extremely high initial permeability as well as maximum permeability with minimum hysteresis loss. There is flexibility in the location of the joint 201 between the top and bottom of the case 108. The design shown for the joint is intended to be illustrative of measures to be taken to insure that external magnetic lines do not penetrate through the joint 201. In the base of the case are a number of feedthroughs 203 that are arranged in a circle reasonably close to the outside diameter of the case 108. The feedthrough pins 203 will be soldered or brazed to the traces on the ceramic circuit board 204 on the inside of the case 108, and brazed or soldered to another board or interconnect flex in the inertial navigation system or other system to which it is mounted. Potentially, these solder connections may be sufficient for mechanically mounting the gyro. The feedthroughs 203 do not need to form a circular pattern if not used for mounting.

The operation of the gyro requires a modulated magnetic field transverse to the main magnetic field. The modulation frequency may be a few hundred Hertz to over 1 MHz depending on the strength of the main magnetic field. It is believed that a single turn loop 107 will be sufficient. For assembly purposes, it may be expedient to attach this loop 107 to the support.

Not illustrated in the drawings is a getter to assure that a hard vacuum is maintained inside the case 108 to prevent excessive power required to operate the cell and VCSELs or VCSEL heaters. Also not illustrated is a second layer of magnetic shielding, which may or may not be required.

Figure 4:
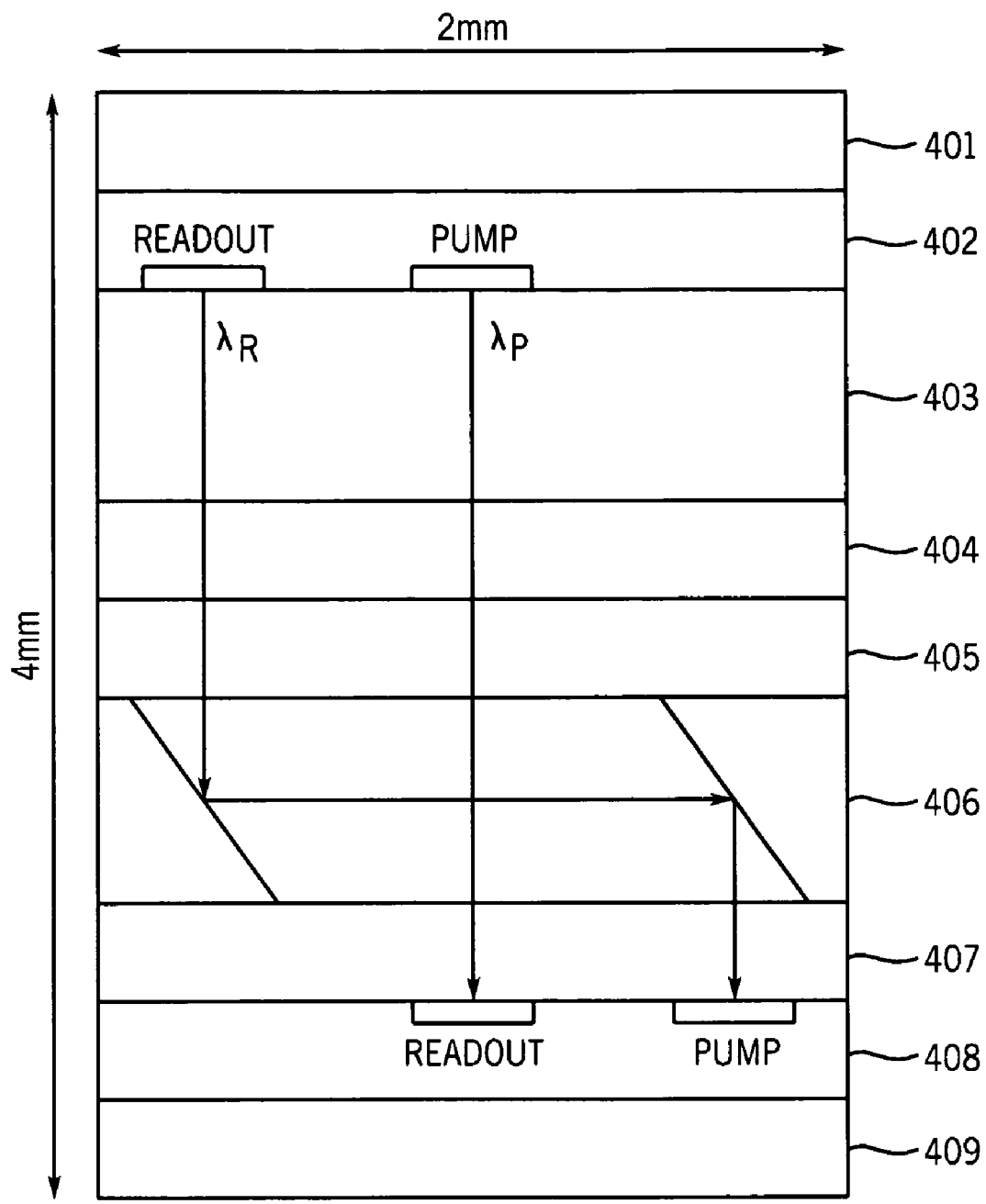
FIG. 4 is a stylized view of a wafer organization of an alternative embodiment of an NMR gyro in accordance with the present invention.

The present invention, as an architecture for a chip-scale nuclear magnetic resonance gyro, is readily adaptable to facilitate the use of batch processing manufacturing methods while preserving the features and configuration of pump and readout optical beams that are required for high performance. The optimum optical configuration places the pump beam parallel to the DC magnetic field imposed on the cell containing the alkali and noble gas mixture, and places the readout beam perpendicular to the DC field. Locating readout and pump lasers on adjacent faces of the cell, as described in the prior embodiment, impacts batch processing of the device. In an alternative embodiment of the invention, modifying the cell design such that reflecting surfaces redirect the readout beam as illustrated in FIG. 4, this limitation can be overcome. Furthermore, a logical stackup of wafers is envisioned as shown in FIG. 4, where, ignoring electronics, source and pump lasers are fabricated on one wafer 402, a second wafer 403 has beam forming optics, a third wafer 404 has a polarizer, wafers 405-407 comprise the cell sides and lids, and wafer 408 has pump and readout detectors. Source control and detection/signal processing electronics wafers 401 and 409 may be added to the stack as shown in FIG. 4.

Figure 5:
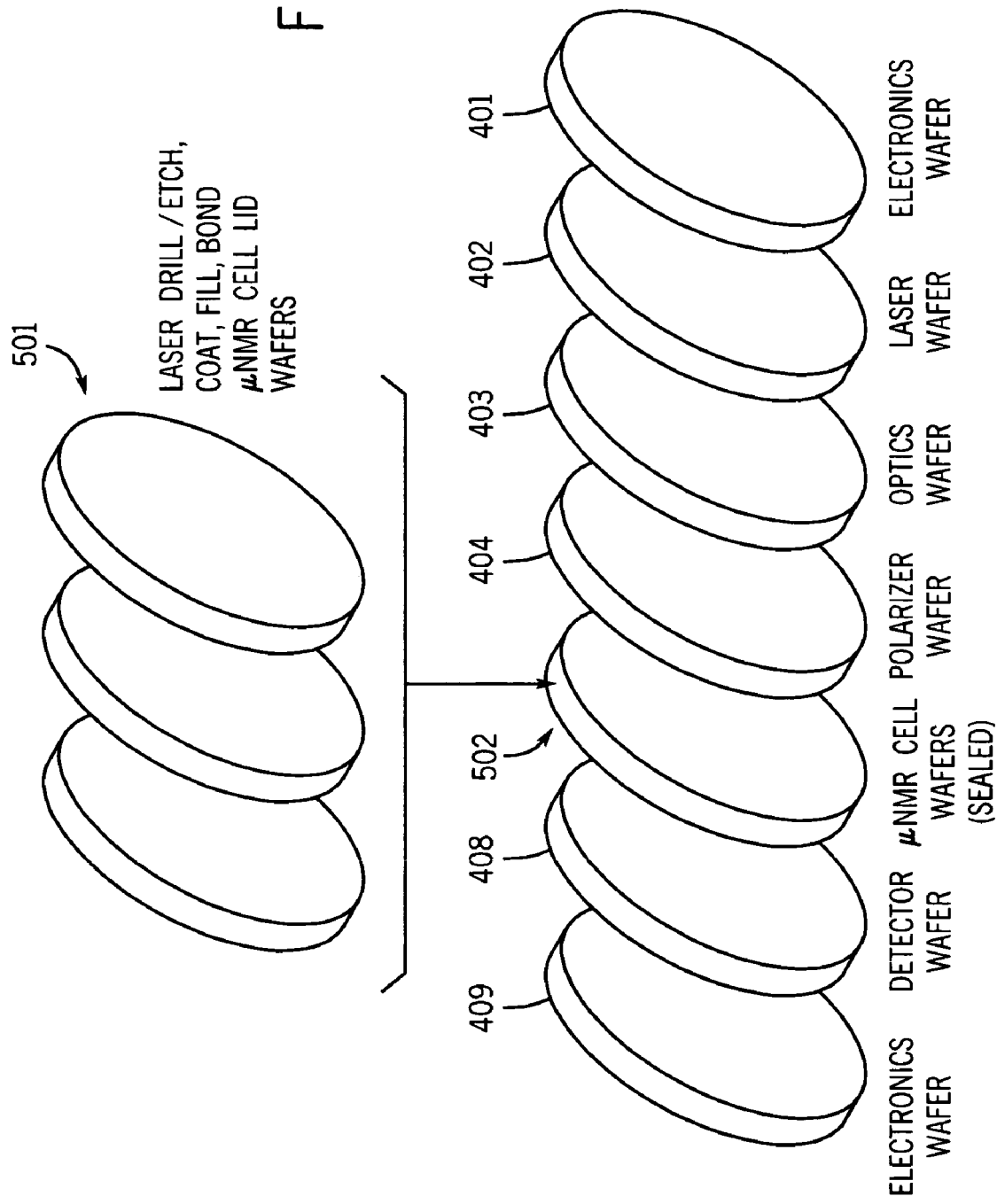
FIG. 5 is an alternative depiction of the wafer organization of FIG. 4.

In FIG. 5, the wafer stackup is shown to logically separate technologies for manufacturing by wafer. For example, two wafers 401 and 409 have integrated electronics, one wafer 402 has laser sources, one wafer 408 includes detectors, another wafer 404 has polarizers, another wafer 403 includes optics, and a set of wafers 501 makes up the NMR cell 502. Segregating technologies shortens development time and enhances manufacturing yields.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An NMR gyro comprising:
   a ceramic support structure having four legs extending outward from a substantially circular central portion, the support structure affixed within a substantially cylindrical enclosure;
   an NMR cell suspended in relative vacuum and affixed to the support structure;
   a plurality of permanent magnets disposed about the NMR cell to produce a magnetic field within the cell; and
   a field coil disposed proximate the cell to produce a modulated magnetic field transverse to the magnetic field produced by the permanent magnets.

2. The NMR gyro of claim 1, wherein the enclosure comprises a substantially cylindrical enclosure formed from HyMu 80 alloy.

3. The NMR gyro of claim 1, wherein the ceramic support structure is affixed to a plurality of support mounts within the enclosure.

4. The NMR gyro of claim 3, wherein the ceramic support structure is affixed to four support mounts within the enclosure.

5. The NMR gyro of claim 1, wherein the plurality of permanent magnets disposed about the NMR cell comprises a plurality of substantially cylindrical permanent magnets disposed in a predetermined pattern about the NMR cell.

6. The NMR gyro of claim 5, wherein the substantially cylindrical permanent magnets are disposed approximately equidistant from the cell.

7. The NMR gyro of claim 6, wherein the substantially cylindrical permanent magnets are disposed at the vertices of a square having the cell located approximately at the center of the square.

8. The NMR gyro of claim 5, wherein the plurality of permanent magnets comprises four permanent magnets.

9. The NMR gyro of claim 1, further comprising a cell heater that maintains cell temperature at about 100 degrees C.

10. The NMR gyro of claim 1, further comprising at least one pump VCSEL affixed to the support structure.

11. The NMR gyro of claim 10, wherein the pump VCSEL forms at least a part of an integrated circuit that includes a detector.

12. The NMR gyro of claim 11, wherein the NMR cell includes a mirrored region disposed oppositely from the VCSEL.

13. The NMR gyro of claim 10, wherein light from the VCSEL is circularly polarized by a quarter-wave plate interposed between the VCSEL and the NMR cell.

14. The NMR gyro of claim 10, further comprising a second VCSEL disposed orthogonally with respect to the pump VCSEL.

15. The NMR gyro of claim 14, wherein light output from the VCSELs is tuned to an absorption wavelength of alkali metal within the NMR cell.

16. The NMR gyro of claim 15, wherein the VCSELs are tuned by adjusting VCSEL temperature.

17. The NMR gyro of claim 15, wherein the VCSELs are tuned by adjusting supply current provided to the VCSELs.

18. The NMR gyro of claim 17, further comprising a circuit board including control circuitry for the VCSELs.

19. The NMR gyro of claim 18, further comprising a plurality of feedthroughs disposed about an exterior surface of the enclosure, the feedthroughs providing electrical connection paths from the enclosure exterior to the circuit board.

20. The NMR gyro of claim 19, wherein the feedthroughs provide both an electrical and a mechanical connection to an external device.

21. The NMR gyro of claim 20, wherein the feedthroughs are disposed in a substantially circular pattern.

22. An NMR gyro comprising:
- a substantially cylindrical enclosure formed from HyMu 80 alloy;
- a ceramic support having four legs extending outward from a substantially circular central portion, the ceramic support affixed within the enclosure;
- an NMR cell suspending in vacuum and affixed to the ceramic support;
- four substantially cylindrical permanent magnets disposed approximately equidistant from the cell, the permanent magnets being disposed at the vertices of a square having the cell at its center;
- a single-turn magnetic field coil disposed to produce a modulated magnetic field transverse to a magnetic field produced by the permanent magnets;
- a cell heater that maintains cell temperature at about 100 degrees C.; and
- at least one pump VCSEL affixed to the ceramic support.

23. The NMR gyro of claim 22, wherein the pump VCSEL forms at least a part of an integrated circuit that includes a detector.

24. The NMR gyro of claim 23, wherein the NMR cell includes a mirrored region disposed oppositely from the VCSEL.

25. The NMR gyro of claim 22, wherein light from the VCSEL is circularly polarized by a quarter-wave plate interposed between the VCSEL and the NMR cell.

26. The NMR gyro of claim 22, further comprising a second VCSEL disposed orthogonally with respect to the pump VCSEL.

27. The NMR gyro of claim 26, wherein light output from the VCSELs is tuned to an absorption wavelength of alkali metal within the NMR cell.

28. The NMR gyro of claim 27, wherein the VCSELs are tuned by adjusting VCSEL temperature.

29. The NMR gyro of claim 27, wherein the VCSELs are tuned by adjusting supply current provided to the VCSELs.

30. The NMR gyro of claim 29, further comprising a circuit board including control circuitry for the VCSELs.

31. The NMR gyro of claim 30, further comprising a plurality of feedthroughs disposed about an exterior surface of the enclosure, the feedthroughs providing electrical connection paths from the enclosure exterior to the circuit board.

32. The NMR gyro of claim 31, wherein the feedthroughs provide both an electrical and a mechanical connection to an external device.

33. The NMR gyro of claim 26, wherein the NMR gyro is fabricated in a batch process with a wafer structure comprising:
- a centrally disposed micro NMR cell wafer disposed between top and bottom lid wafers;
- a detector wafer adjacent the NMR cell wafer;
- an electronics wafer including detection and signal processing electronics adjacent the detector wafer;
- a polarizer wafer adjacent the NMR cell wafer on a side opposite the detector wafer;
- an optics wafer adjacent the polarizer wafer;
- a laser wafer including readout and pump VCSELs adjacent the optics wafer; and
- a source control electronics wafer adjacent the laser wafer.

* * * * *